(12) United States Patent
Kawai et al.

(10) Patent No.: US 7,348,492 B1
(45) Date of Patent: Mar. 25, 2008

(54) FLEXIBLE WIRING BOARD AND ELECTRICAL DEVICE USING THE SAME

(75) Inventors: Noriko Kawai, Kashihara (JP); Takashi Nakashima, Nara (JP); Hirokazu Yoshida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 245 days.

(21) Appl. No.: 09/712,227

(22) Filed: Nov. 15, 2000

(30) Foreign Application Priority Data

Nov. 17, 1999 (JP) .................................. 11-327023
Oct. 19, 2000 (JP) ............................. 2000-319874

(51) Int. Cl.
*H05K 1/00* (2006.01)

(52) U.S. Cl. ..................... 174/254; 361/748; 361/803; 174/259

(58) Field of Classification Search ................ 174/254, 174/259, 267; 361/748–751, 792–795, 803
See application file for complete search history.

(56) References Cited

U.S. PATENT DOCUMENTS

| | | | | |
|---|---|---|---|---|
| 3,437,882 | A | * | 4/1969 | Cayzer ........................ 361/791 |
| 3,573,345 | A | * | 4/1971 | Devries et al. ............. 174/254 |
| 3,596,228 | A | * | 7/1971 | Reed et al. .................. 439/513 |
| 3,832,769 | A | * | 9/1974 | Olyphant et al. ............. 29/830 |
| 3,967,162 | A | * | 6/1976 | Ceresa et al. ................ 361/751 |
| 3,971,610 | A | * | 7/1976 | Buchoff et al. ................ 439/75 |
| 4,713,494 | A | * | 12/1987 | Oikawa et al. ............. 174/257 |
| 5,014,162 | A | * | 5/1991 | Clark et al. .................. 361/784 |
| 5,229,550 | A | * | 7/1993 | Bindra et al. ................ 174/262 |
| 5,263,243 | A | * | 11/1993 | Taneda et al. ................. 29/830 |
| 5,288,950 | A | | 2/1994 | Ushio et al. |

(Continued)

FOREIGN PATENT DOCUMENTS

JP         02-23001         6/1990

(Continued)

OTHER PUBLICATIONS

Taiwanese Office Action mailed Mar. 22, 2002 with English Translation.

(Continued)

*Primary Examiner*—Jeremy C Norris
(74) *Attorney, Agent, or Firm*—Nixon & Vanderhye P.C.

(57) ABSTRACT

A flexible wiring board is obtained as follows. A copper foil pattern is formed on the both surfaces of a base polymer film made of polyimide, etc. The copper foil pattern of the both sides, except for an end portion of the copper foil pattern of one surface, is covered entirely with an insulative protecting film made of polyimide, etc., for protecting the copper foil pattern, and the insulative protecting film and the copper foil pattern are bonded with each other by an insulative protecting film adhesive layer. On the exposed end portion of the copper foil pattern on one surface is formed a plated layer to be connected to an electrical component. The thickness of the insulative protecting film which is bonded with the surface on which the plated layer is formed is set to be thinner than the base polymer film. As a result, it is ensured that insulation failure of the insulative protecting film is prevented, and wire breakage of wiring when bent can easily be prevented.

10 Claims, 6 Drawing Sheets

U.S. PATENT DOCUMENTS

| | | | |
|---|---|---|---|
| 5,298,685 A * | 3/1994 | Bindra et al. | 174/250 |
| 5,408,052 A * | 4/1995 | Inaba et al. | |
| 5,444,188 A | 8/1995 | Iwayama et al. | |
| 5,452,182 A * | 9/1995 | Eichelberger et al. | 174/254 |
| 5,499,444 A * | 3/1996 | Doane et al. | 29/830 |
| 5,590,465 A * | 1/1997 | Santo | |
| 5,818,697 A * | 10/1998 | Armezzani et al. | 361/749 |

FOREIGN PATENT DOCUMENTS

| | | |
|---|---|---|
| JP | 3-41960 | 4/1991 |
| JP | 4-70630 U | 6/1992 |
| JP | 7-92480 A | 4/1995 |
| JP | 08-018174 | 1/1996 |
| JP | 9-138387 A | 5/1997 |
| JP | 09-214082 | 8/1997 |
| JP | 3201363 B2 | 6/2001 |

OTHER PUBLICATIONS

Chinese Office Action dated Sep. 26, 2003 (along with English translation thereof).

* cited by examiner

FLEXIBLE WIRING BOARD AND ELECTRICAL DEVICE USING THE SAME

FIELD OF THE INVENTION

The present invention relates to a flexible wiring board having wiring on a flexible insulating substrate, which is to be connected to various electrical components such as, in particular, liquid crystal display elements. The invention also relates to an electrical device which includes the flexible wiring board being connected to various electrical components, and, in particular, an electrical device (liquid crystal display device) including the flexible wiring board being connected to the liquid crystal display element.

BACKGROUND OF THE INVENTION

Conventionally used is a flexible wiring board having a wiring pattern on a flexible insulating substrate which is made of polymer such as polyimide for connection between various electrical components, in particular, between a liquid crystal display element and a driving circuit.

Figure 5:
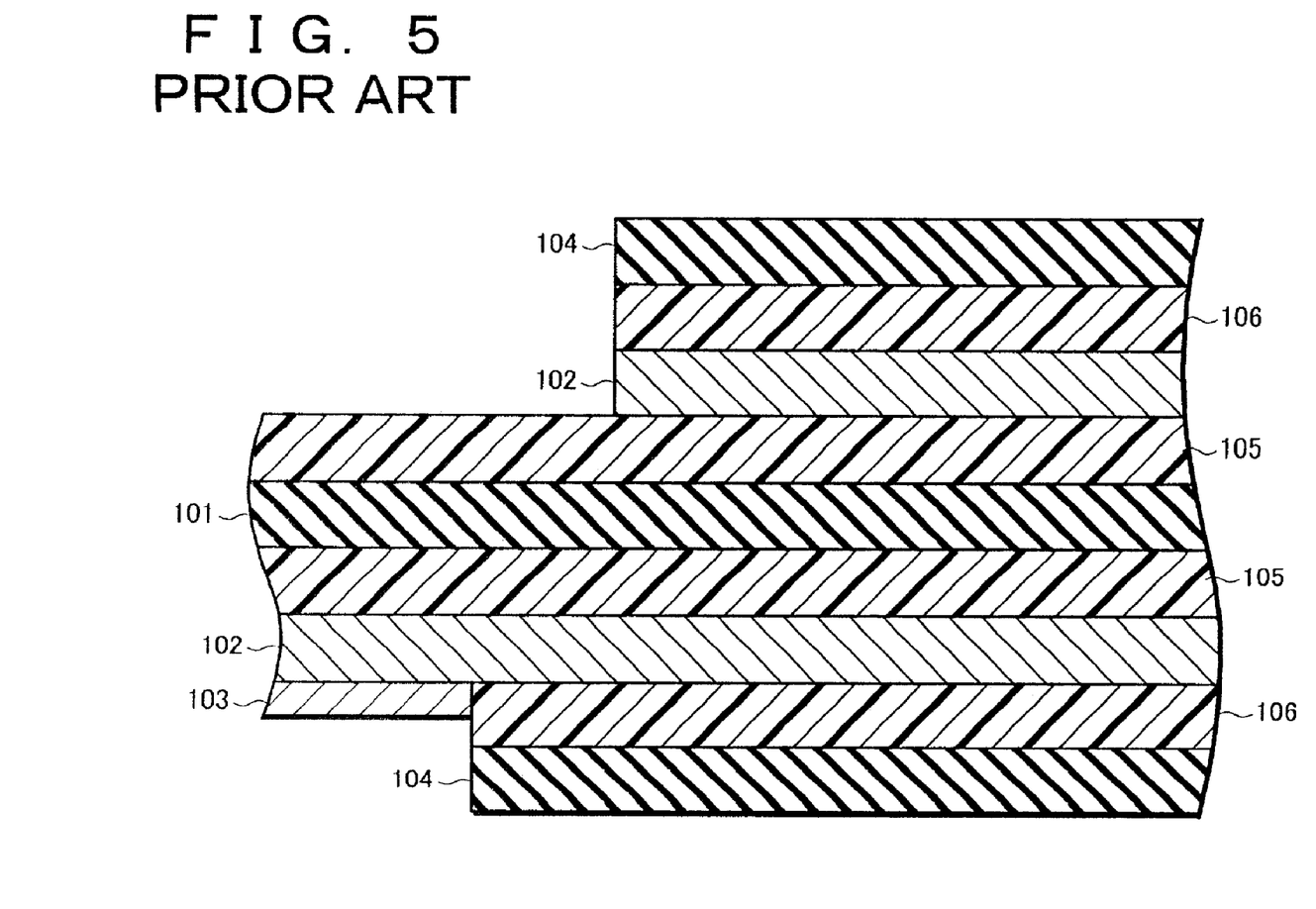
FIG. 5 is a partial cross sectional view of a conventional flexible wiring board.

An example of the conventional flexible wiring board will be described based on FIG. 5 which shows a cross section thereof. As shown in FIG. 5, by a copper foil adhesive layer 105, a copper foil pattern 102 is bonded with a base polymer film 101 which is a flexible insulating substrate made of polymer (flexible substrate). The adhesive used for the copper foil adhesive layer 105 includes epoxy resin or phenol resin, etc.

Further, the copper foil pattern 102 is covered with an insulative protecting film 104 made of polymer, and the insulative protecting film 104 is bonded with the copper foil pattern 102 by an insulative protecting film adhesive layer 106. However, an end portion of the copper foil pattern 102 is not covered with the insulative protecting film 104 and is exposed to function as a terminal portion to be connected to an external electrical component.

The insulative protecting film 104 has the functions of insulating the copper foil pattern 102 from outside, protecting the copper foil pattern 102 from corrosion such as rust, and increasing folding endurance of the flexible wiring board. As the material of the insulative protecting film 104, polyimide is commonly used.

On the surface of the exposed portion (terminal portion) of the copper foil pattern 102 is formed a plated layer 103 by Au/Ni plating (Au plating over underlying Ni layer) or Sn plating so as to stabilize the connection to the external electrical component by preventing rust on the copper foil pattern 102.

Note that, even though FIG. 5 shows the arrangement where the base polymer film 101 and the copper foil pattern 102 are bonded by the adhesive (copper foil adhesive layer 105), the arrangement where the base polymer film 101 and the copper foil pattern 102 are directly bonded with each other without using the adhesive, i.e., an adhesive-less flexible wiring board has been used as well.

In response to the recent reduction in external size of various electrical devices, there has been strong demand for efficient use of space for mounting components of these devices. Accordingly, there is need to bend the flexible wiring board which is connected to a connection terminal of an electrical component such as a liquid crystal display element and which supplies to the connection terminal various signals such as inputs from other electrical components which are disposed independently (separately) from the above electrical component, so as to avoid interfering the mount of the other electrical components and to reduce the size of the entire device including these electrical components, depending on where the device is disposed.

Especially, when the conventional flexible wiring board is to be connected to an end portion of the electrical component such as the liquid crystal display element, it is required to bend the flexible wiring board at the position as close as possible to the end portion of the electrical component.

Figure 6:
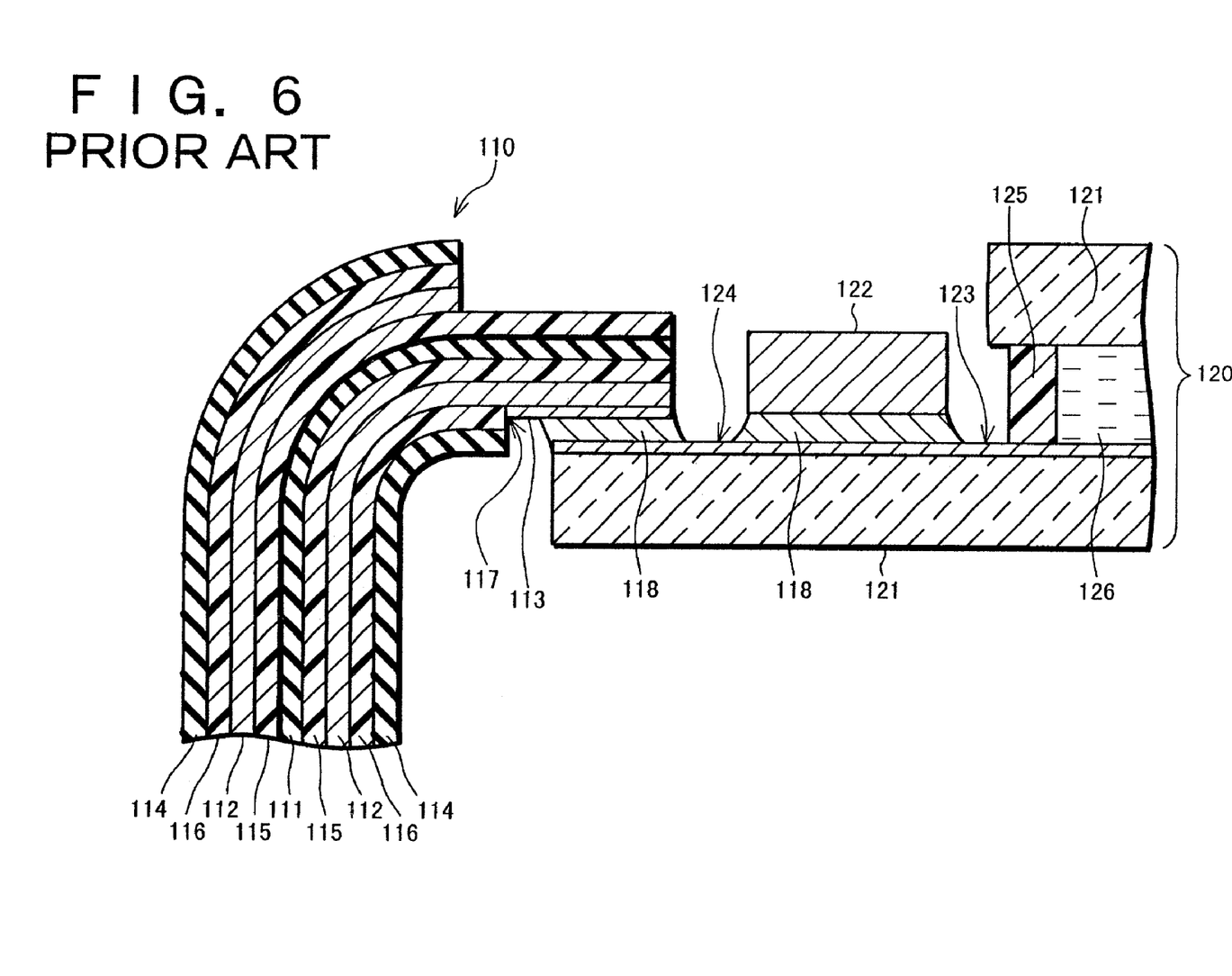
FIG. 6 is a cross sectional view of the flexible wiring board when it is connected to a liquid crystal panel and is bent 90° downward.

FIG. 6 shows a cross section of the conventional flexible wiring board in a state where it is connected to an end portion of a liquid crystal panel mounting an IC (Integrated Circuit) chip 122 thereon by the chip-on-glass method ("COG" method hereinafter), and is bent 90° in a direction (downward in FIG. 6) which would make the connected surface to face inward.

As shown in FIG. 6, the flexible wiring board 110 has the same layer structure as the flexible wiring board of FIG. 5, and includes a base polymer film 111, copper foil pattern 112, plated layer 113 which is plated, for example, by Au/Ni plating, insulative protecting film 114, copper foil adhesive layer 115, and insulative protecting film adhesive layer 116, which are analogous to the base polymer film 101, copper foil pattern 102, plated layer 103, insulative protecting film 104, copper foil adhesive layer 105, and insulative protecting film adhesive layer 106, respectively.

Meanwhile, the liquid crystal display element 120 is arranged such that a liquid crystal layer 126 is filled between a pair of glass substrates 121 and sealed by a sealant 125 therebetween, and one of glass substrates 121 (lower glass substrate 121 in FIG. 6), which is larger than the other glass substrate 121 (upper glass substrate 121 in FIG. 6), extends beyond the upper glass substrate 121.

The inner surface of the extending glass substrate 121 is connected to an IC chip 122 which generates a video signal or driving signal for driving the liquid crystal (liquid crystal layer 126) based on external input signals, and on an end portion on the inner surface of the extending glass substrate 121 is laid an end portion of the flexible wiring board 110 so that a connection terminal of the flexible wiring board 110 (portion where the plated layer 113 is provided) is connected thereto.

Further, there are provided a connecting section 124 which includes an input electrode for inputting signals to the IC chip 122 and a webbed wiring pattern for supplying signals to the input electrode from the flexible wiring board 110, and a connecting section 123 which includes an output electrode for outputting the video or driving signal from the IC chip 122 and a webbed wiring pattern for supplying the video or driving signal from the output electrode with respect to an electrode section (not shown) for applying a voltage to the liquid crystal layer 126 which is provided on the inner surface of the glass substrate 121. There is electrical conduction by an anisotropic conductive film 118 between the plated layer 113 and the connecting section 124, and between the IC chip 122 and the connecting sections 123 and 124.

Further, as shown in FIG. 6, the flexible wiring board 110 is bent 90° at a position slightly shifted outward from the end of the liquid crystal panel 120 in a direction (downward in FIG. 6) which would make the distant end of the flexible wiring board 110 from the liquid crystal panel 120 to approach the liquid crystal panel 120 with the side of the flexible wiring board 110 provided with the plated layer 113 facing inward.

Note that, FIG. 6 shows the arrangement where the base polymer film 111 and the copper foil pattern 112 are bonded by the adhesive (copper foil adhesive layer 115), yet the arrangement where the base polymer film 111 and the copper foil pattern 112 are directly bonded with each other without using the adhesive, i.e., an adhesive-less flexible wiring board has been used as well.

The conventional flexible wiring boards as shown in FIGS. 5 and 6 normally employed the insulative protecting films 104 and 114 having the same thickness as that of the base polymer films 101 and 111 without particularly using the insulative protecting films 104 and 114 having a thinner thickness than that of the base polymer films 104 and 114.

The inventors of the present invention have once used a polymer film having a thickness of 25 μm as the base polymer films 101 and 111 or the insulative protecting films 104 and 114. This was due to various drawbacks with the polymer film having a thickness thinner than 25 μm, such as difficulty in handling such a film due to its thickness, which causes wrinkles to generate and leads to misalignment, exposing the wiring which should not be exposed.

In order to improve the flexibility of the flexible wiring board, study was made by the inventors of the present invention to make the thickness of the polymer film (base polymer films 101 and 111 or insulative protecting films 104 and 114) thinner than 25 μm.

To this end, the inventors of the present invention first prepared a flexible wiring board only as the base polymer films 101 and 111 having a thickness of 12.5 μm, thinner than 25 μm. This was because the base polymer films 101 and 111 as prepared by the inventors of the present invention were bonded with the copper foil and therefore they were relatively easy to handle even with the thickness thinner than 25 μm, whereas the insulative protecting films 104 and 114 need to be handled as the film and become difficult handle when the thickness is made thinner than 25 μm.

Despite this, the flexible wiring board thus prepared was very susceptible to wire breakage of the copper foil pattern 112 when the flexible wiring board was bent to mount it on the liquid crystal panel 120. Accordingly, the yield of the liquid crystal display device was significantly low. The same problem was found to exist also for the insulative protecting films 104 and 114 having the same thickness as that of the base polymer films 101 and 111 prepared.

This problem is caused by the following mechanism. When the insulative protecting films 104 and 114 having the same or thicker thickness than that of the base polymer films 101 and 111 are used, by the rigidity of the insulative protecting films 104 and 114, there generates a large difference in rigidity between a portion of the flexible wiring board covered with the insulative protecting films 104 and 114, and a portion not covered with the insulative protecting films 104 and 114. As a result, bending stress when the flexible wiring board is bent concentrates on a boundary portion (boundary portion 117 in FIG. 6) between the insulative protecting films 104 and 114, and the plated layers 103 and 113 with the likely result of wire breakage of the copper foil pattern 112 running in a direction perpendicular to the line of bend (bend line).

Thus, the conventional flexible wiring board has the problem of low wiring reliability.

In order to solve this problem, for example, Japanese Unexamined Utility Model No. 70630/1992 (Jitsukaihei 4-70630) (published date: Jun. 23, 1992) proposes a structure wherein a copper foil pattern is exposed at the portion where the flexible wiring board is bent by removing the insulative protecting film therefrom, and the copper foil pattern thus exposed is plated to prevent rust.

However, in this structure, even though the copper foil pattern at the bending portion is plated to prevent rust, the copper foil pattern is not covered with the insulative protecting film over a wide range from a region in the vicinity of the connected portion to the region where bending is made, and thus the copper foil pattern is not protected both electrically and chemically over this area. Thus, the copper foil pattern may not be shielded efficiently over the unprotected area, or wire breakage of the copper foil pattern may generate.

Further, since the flexible wiring board is bent at the plated portion, in the case where plating is made by Au/Ni plating, which offers superior connection stability, it becomes difficult to bend the copper foil pattern by the rigid Ni film and the copper foil pattern becomes susceptible to cracking. Thus, wire breakage is more likely to occur when bent and reliability may suffer contrary to the intended purpose.

Further, for example, Japanese Unexamined Patent Publication No. 138387/1997 (Tokukaihei 9-138387) (published date: May 27, 1997) proposes preventing wire breakage in a circuit pattern by making the end portion of the insulative protecting film to have a wave so as to disperse the stress applied on the boundary of the insulative protecting film and the plated portion when bent.

However, because this structure employs forming a wave on the insulative protecting film, manufacture of the flexible wiring board becomes complex, resulting in inefficient manufacture and increased manufacturing cost, and also the dimension of the flexible wiring board is increased for the height of the wave formed on the insulative protecting film.

Further, for example, Japanese Unexamined Patent Publication No. 92480/1995 (Tokukaihei 7-92480) (published date: Apr. 7, 1995) proposes an arrangement of a flexible wiring board having circuit wiring on the both sides of the flexible substrates, in which an insulative protecting film (film cover lay) is pasted on one surface of the flexible substrate using an adhesive, and on the other surface of the flexible wiring is applied, instead of the insulative protecting film, liquid resin (thermosetting resin) such as liquid polyimide resin (polyimide ink) or resist (resist ink) which is cured thereon so as to form an insulative protecting film (ink cover lay).

According to this arrangement, using ink cover lay which is more flexible than film cover lay, the surface on which the cured liquid resin is formed is connected to a display panel and the connected surface is bent in a direction to face inward. As a result, compared with the arrangement where the insulative protecting films are pasted on the both surfaces, less stress concentrates at the boundary of the cover lay and the plated portion and wire breakage of the circuit wiring can be prevented to some degree.

However, since the ink cover lay is formed by applying liquid resin, it is susceptible to nonuniformity. Especially, because the conductor pattern such as a copper foil which is formed as the circuit wiring includes a large number of "ribs" which are protrusions on the surface of the flexible substrate and because there are level differences between the surface of the flexible substrate and the protrusions of the ribs, the liquid resin may not be applied on the side surface of the ribs. Thus, the foregoing arrangement has the problem of insulation failure especially at the side surface of the ribs of the conductor pattern.

Further, the liquid resin used to form the ink cover lay includes epoxy resin or polyimide resin (liquid polyimide), and the ink cover lay which is made of cured resist has poor insulation and poor reliability (certainty of offering insulative and physical protection is poor). Also, since the curing temperature of polyimide is high, heating at high temperature is required. Thus, with the flexible wiring board in which the copper foil pattern (wiring) is pasted by the copper foil adhesive, the copper foil adhesive, which generally has inferior heat resistance, deteriorates. This sets a limit to the use of polyimide resin to an expensive adhesive-less flexible wiring board. That is, the ink cover lay using polyimide resin has limited use compared with the insulative protecting film which is pasted by the adhesive.

Note that, in recent years, there has been a demand for further reducing the weight of a module, for example, in liquid crystal panels. To this end, there has been active research on use of thinner glass substrates or thinner plastic substrates to reduce the weight of the substrate which takes up a large proportion of the total weight. In view of these backgrounds, there is need for a flexible wiring board with smaller bend radius while maintaining high reliability.

SUMMARY OF THE INVENTION

It is an object of the present invention to provide a flexible wiring board which includes an insulative protecting film for covering wiring and which is used in a bent form, which can surely prevent insulation failure of the insulative protecting film and easily prevent wire breakage when bent and has superior reliability, and to provide an electrical device using such a flexible wiring board.

In order to achieve the foregoing object, a flexible wiring board of the present invention includes: a flexible insulating substrate; wiring which is provided only on one surface of the insulating substrate; an insulative protecting film, provided only on one surface of the insulating substrate, for protecting the wiring; and a terminal portion, provided on the wiring, to be connected to an external electrical component, wherein the insulative protecting film is a polymer film, and is placed to cover the wiring except for at least the terminal portion, and is bonded with the insulating substrate via an adhesive, and is thinner than the insulating substrate.

By thus making the thickness of the insulative protecting film thinner than the insulating substrate, there will be a smaller difference in rigidity between a portion covered with the insulative protecting film and a portion not covered with the insulative protecting film, thus relieving stress on the boundary portion between the insulative protecting film and the terminal portion when bent. Further, by bonding the insulative protecting film with an adhesive, it is ensured that the insulating film is formed on the wiring. Therefore, with the foregoing arrangement, it is possible to provide a flexible wiring board which surely prevents insulation failure of the insulative protecting film, and which easily prevents wire breakage of the wiring when bent.

In order to achieve the foregoing object, a flexible wiring board of the present invention includes: a flexible insulating substrate; first wiring provided on one surface of the insulating substrate; first insulative protecting film, provided on one surface of the insulating substrate, for protecting the first wiring; second wiring provided on the other surface of the insulating substrate; second insulative protecting film, provided on the other surface of the insulating substrate, for protecting the second wiring; and a terminal portion, provided on at least one of the first wiring and the second wiring, to be connected to an external electrical component, wherein the first insulative protecting film and the second insulative protecting film are both polymer film, and are placed to cover the first wiring and the second wiring except for at least the terminal portion, and are bonded with the insulating substrate via an adhesive, and at least one of the first insulative protecting film and the second insulative protecting film, which is connected to the surface on which the terminal portion is provided is thinner than the insulating substrate.

By thus making the thickness of the insulative protecting film which is bonded on the surface on the side of the terminal portion thinner than the thickness of the insulating substrate, there will be a smaller difference in rigidity between a portion covered with the insulative protecting film and a portion not covered with the insulative protecting film, thus relieving stress on the boundary portion between the insulative protecting film and the terminal portion. Further, by bonding the insulative protecting film with an adhesive, it is ensured that insulating film is formed on the wiring. Therefore, with the foregoing arrangement, it is possible to provide a flexible wiring board which surely prevents insulation failure of the insulative protecting film, and which easily prevents wire breakage of the wiring when bent.

In order to achieve the foregoing object, an electrical device of the present invention includes the flexible wiring board having any of the foregoing arrangements and an electrical component, wherein one end portion of the flexible wiring board is connected to the electrical component while being laid over the electrical component, and the flexible wiring board is bent at a position other than the terminal portion.

With this arrangement, in addition to providing the electrical device which surely prevents insulation failure of the insulative protecting film of the flexible wiring board and which easily prevents wire breakage of the wiring when bent, the flexible wiring board can be stored in the electrical device by being bent at an arbitrary angle depending on where it is disposed, thus miniaturizing the electrical device.

For a fuller understanding of the nature and advantages of the invention, reference should be made to the ensuing detailed description taken in conjunction with the accompanying drawings.

DESCRIPTION OF THE EMBODIMENTS

First Embodiment

Figure 1:
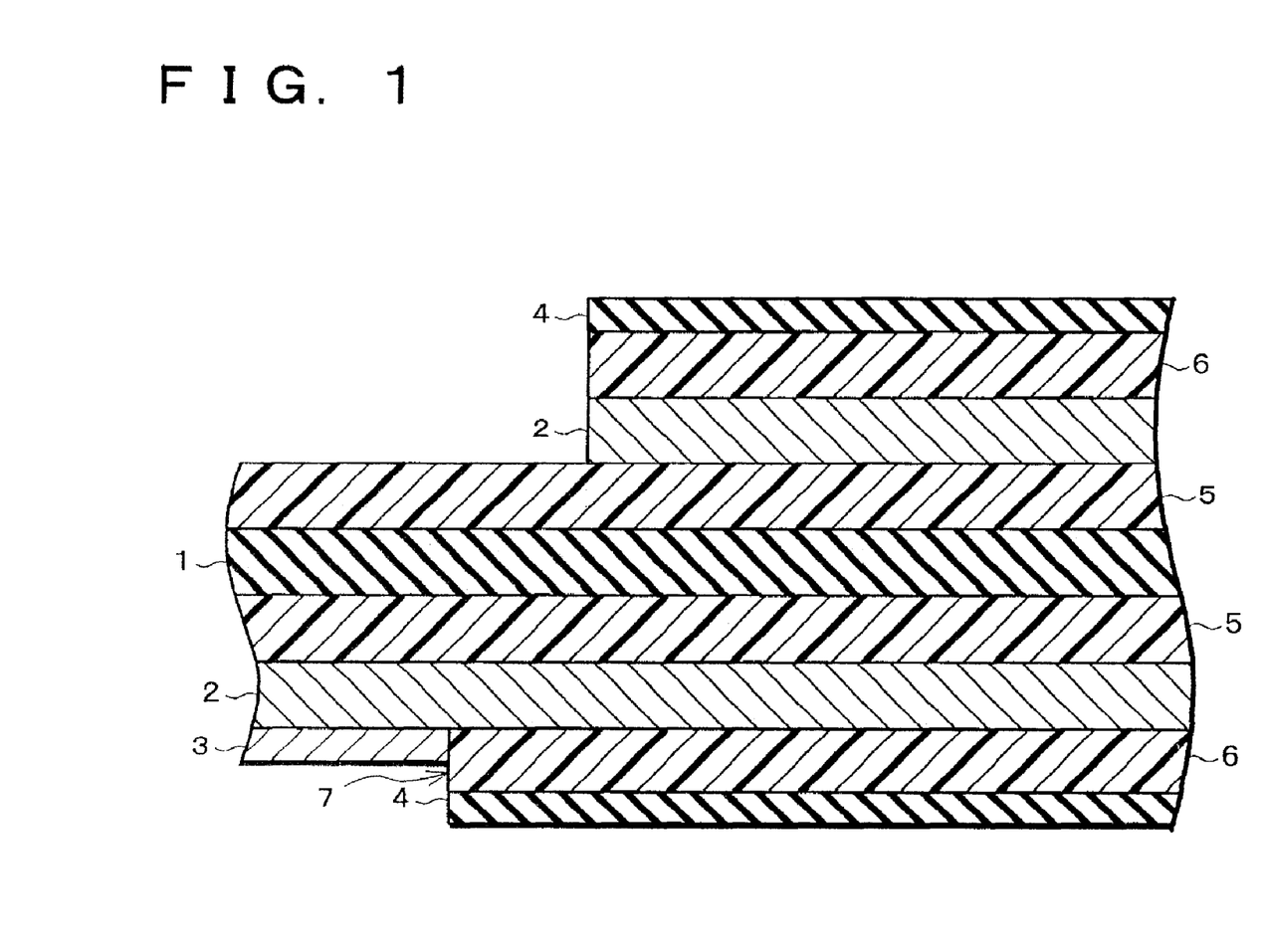
FIG. 1 is a partial cross sectional view of a flexible wiring board in accordance with one embodiment of the present invention.

The following will describe one embodiment of a flexible wiring board in accordance with the present invention referring to FIG. 1 which shows a cross section of the flexible wiring board. As shown in FIG. 1, the flexible wiring board of the present embodiment includes a base polymer film made of polymer (flexible insulating substrate) 1, and copper foil patterns (wiring) 2 which are bonded on the both sides of the base polymer film 1 by copper foil adhesive layers 5, respectively.

The material of the base polymer film 1 is not particularly limited, but polyimide, which has superior flexibility and superior heat resistance, is preferable. The thickness of the base polymer film 1 is generally set within a range of 12.5 µm to 75 µm, for example, at 12.5 µm, 25 µm, 50 µm, or 75 µm. Base polymer film 1 thinner than 12.5 µm is difficult to handle and thus difficult to manufacture. The thickness of base polymer film 1 exceeding 50 µm is not preferable because the flexibility of flexible wiring board 10 suffers. The optimum thickness range of the base polymer film 1 is between not less than 12.5 µm and not more than 50 µm since a thickness within this range offers desirable flexibility and is easy to handle.

The thickness of the copper foil adhesive layer 5 is within a range of about 10 µm to 20 µm. The thickness of the copper foil adhesive layer 5 is preferably about the same as that of the copper foil pattern 2, and when the thickness of the copper foil pattern 2 is 18 µm, the thickness of the copper foil adhesive layer 5 is preferably about 18 µm. As the adhesive for the copper foil adhesive layer 5, epoxy resin or phenol resin, etc., is used.

The thickness of the copper foil pattern 2 is set at 18 µm in the present embodiment. The copper foil pattern 2 is formed, for example, by wet etching a copper foil after bonding it on the base polymer film 1 with the copper foil adhesive layer 5.

The respective copper foil patterns 2 are covered with insulative protecting films (polymer films) 4 made of polymer. However, one end portion of one of the copper foil patterns 2 is exposed without being covered by the insulative protecting film 4, and this exposed portion acts as a terminal portion to be connected to an external electrical component. Further, the both copper foil patterns 2 are electrically connected to each other via a through hole which is provided through the base polymer film 1. Note that, the terminal portion may be provided on both of the copper foil patterns 2 and in this case the through hole may be omitted.

The insulative protecting films 4 are bonded with their respective copper foil patterns 2 with insulative protecting film adhesive layers (adhesive) 6. The insulative protecting films 4 have functions of insulating the copper foil patterns 2 from outside, protecting the copper foil patterns 2 from corrosion such as rust, and increasing folding endurance of the flexible wiring board.

The material of the insulative protecting film 4 is not particularly limited, but polyimide, which has superior flexibility and superior heat resistance is preferable. Further, as the adhesive which makes up the insulative protecting film adhesive layers 6, for example, an epoxy resin adhesive agent, acrylic resin adhesive agent, or polyester adhesive agent is used. The thickness of the insulative protecting film adhesive layer 6 is in a range of about 15 µm to 30 µm. It is further preferable that the thickness of the insulative protecting film adhesive layer 6 is about 25 µm.

In the present embodiment, the insulative protecting film is formed by bonding a pre-molded insulative protecting film 4 with the adhesive (insulative protecting film adhesive layer 6), instead of forming it by curing an applied liquid resin by heat, thus attaining uniform thickness of the insulative protecting film. Thus, compared with the case where the conventional ink cover lay is used, it is possible to prevent insulation failure with certainty. Further, because bonding is made using the adhesive, unlike the case where an applied liquid resin is cured by heat, heat is not required to form the insulative protecting film, thus allowing use of an adhesive having low heat resistance for the copper foil adhesive layers 5 and therefore having greater applicability.

On the surface of the exposed portion (terminal portion) of the copper foil pattern 2 is formed a plated layer 3 by Au/Ni plating (Au plating on underlaying Ni layer) or Sn plating so as to prevent rust on the copper foil pattern 2 for the purpose of stabilizing the connection with the electrical component.

Further, in the present embodiment, the thickness of the insulative protecting film 4 on the side of the plated layer 3 (lower side in FIG. 1) is made thinner than the thickness of the base polymer film 1. This relieves bending stress on a boundary portion 7 between the insulative protecting film 4 and the plated layer 3 when the flexible wiring board is bent, compared with the conventional flexible wiring board which uses polymer films of the same thickness for both the insulative protecting film and the base polymer film, thus effectively preventing wire breakage of the copper foil pattern 2 at the boundary portion 7 between the insulative protecting film 4 and the plated layer 3 when the flexible wiring board is bent repeatedly.

Figure 2:
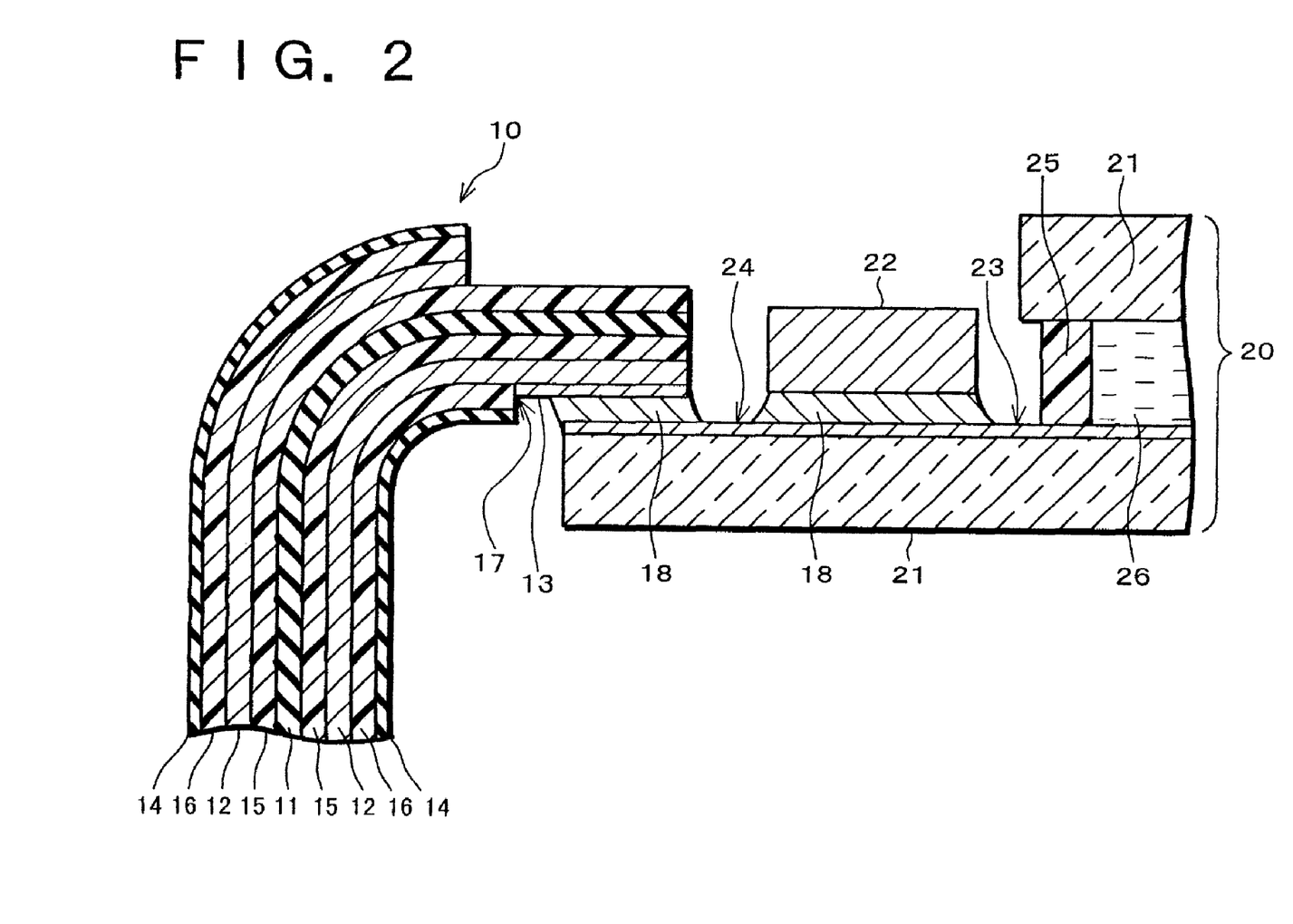
FIG. 2 is a cross sectional view of a flexible wiring board in accordance with another embodiment of the present invention when it is connected to a liquid crystal panel and bent 90° downward.

The following describes an example of an electrical device which is composed of the flexible wiring board of the present invention being connected to an electrical component, with reference to a liquid crystal display device wherein a flexible wiring board having the same arrangement as the flexible wiring board of FIG. 1 is connected to one end portion of a liquid crystal panel of the COG mount and the flexible wiring board is bent 90° in a direction with the surface of the flexible wiring board connected to the liquid crystal panel facing inward, referring to FIG. 2.

As shown in FIG. 2, a flexible wiring board 10 has the same layer structure as the flexible wiring board of FIG. 1, and includes a base polymer film 11, copper foil pattern 12, plated layer 13 of, for example, Au/Ni plating, insulative protecting film 14, copper foil adhesive layer 15, and insulative protecting film adhesive layer 16, which are equivalent to the base polymer film 1, copper foil pattern 2, plated layer 3, insulative protecting film 4, copper foil adhesive layer 5, and insulative protecting film adhesive layer 6, respectively.

A liquid crystal panel 20 as the liquid crystal display element includes a liquid crystal layer 26 between a pair of glass substrates 21, sealed by a sealant 25, where one of the glass substrates 21 (glass substrate 21 on the lower side of FIG. 2) is larger than the other glass substrate 21 (glass substrate 21 on the upper side of FIG. 2), extending beyond the smaller glass substrate 21.

The surface of one of the glass substrate 21 extending beyond and facing the other glass substrate 21 is connected to an IC chip 22 which generates a video signal or driving signal for driving the liquid crystal (liquid crystal layer 26) based on externally inputted signals, and on one end portion of which surface is stacked an end portion of the flexible wiring board 10, to be connected to the terminal portion (where plated layer 13 is formed) of the flexible wiring board 10.

Further, there are provided an input electrode for inputting a signal into the IC chip 22, a connecting section 24 made up of a webbed wiring pattern for supplying signals to the input electrode from the flexible wiring board 10, an output electrode for outputting a video signal or driving signal from the IC chip 22, and a connecting section 23 made up of a webbed wiring pattern for supplying a video signal or driving signal from the output electrode with respect to an electrode portion (not shown) for applying a voltage to the liquid crystal layer 26 provided on the inner sides of the glass substrates 21. There is electrical conduction by an anisotropic conductive film 18 between the plated layer 13 and the connecting section 24, and between the IC chip 22 and the connecting sections 23 and 24.

As shown in FIG. 2, the flexible wiring board 10 is bent 90° at a position slightly shifted outward from an end portion of the liquid crystal panel 20 so that the surface of the flexible wiring board 10 on the side of the plated layer 13 faces inward, i.e., in a direction (downward direction in FIG. 2) which would make the distant end of the flexible wiring board 10 from the liquid crystal panel 20 to approach the liquid crystal panel 20.

In the flexible wiring board 10, as with the flexible wiring board of FIG. 1, the thickness of the insulative protecting film 14 on the side of the plated layer 13 (lower side of FIG. 2) is made thinner than the thickness of the base polymer film 11. This relieves the stress on the boundary portion 17 of the insulative protecting film 14 and the plated layer 13 when bent compared with the case where the insulative protecting film 14 and the base polymer film has the same thickness. As a result, it is possible to effectively prevent wire breakage of the copper foil pattern 12 at the boundary portion 17 between the insulative protecting film 14 and the plated layer 13 when the flexible wiring board is bent repeatedly.

Further, in the flexible wiring board 10, the plated layer 13 is formed only on one side of one of the copper foil patterns 12, and one of the insulative protecting films 14 which is provided on one side of the base polymer film 11 opposite the plated layer 13 is disposed such that one end of the insulative protecting film 14 closer to the plated layer 13 is farther away from one end of the base polymer film 11 where the plated layer 13 is provided than one end of the other insulative protecting film 14 which is provided on the side of the plated layer 13 of the base polymer film 11 closer to the plated layer 13. Further, in the flexible wiring board 10, on the both sides of the base polymer film 11, there exist blank areas where no insulative protecting films 14 are formed, and the plated layer 13 is formed only on one of the copper foil pattern 12 in one of the blank areas where the insulative protecting films 14 are not provided, and the area of the blank area of the base polymer film 11 on the other side of the plated layer 13 is larger than the other blank area of the side where the plated layer 13 is provided. With this arrangement, the stress on the plated layer 13 when the flexible wiring board 10 is bent can be further relieved, thus further preventing wire breakage of the copper foil pattern 12.

The boundary portion 17 of the insulative protecting film 14 and the plated layer 13 is preferably distanced by at least 0.2 mm from the end of the glass substrate 21 to be connected to the plated layer 13. Thus, it is preferable that the boundary portion 17 between the plated layer 13 and the insulative protecting film 14 on the side of the base polymer film where the plated layer 13 is provided is distanced by at least 0.2 mm from the end of the glass substrate 21 to be connected to the plated layer 13 of the base polymer film 11. With this arrangement, the stress on the connected portion of the flexible wiring board 10 and the glass substrate 21 when the flexible substrate 10 is bent can be relieved to prevent wire breakage, thereby improving reliability of the electrical connection at the connected portion. Further, it is possible to prevent bendability (flexibility) from suffering and prevent stress on the connected portion, which may be caused by the insulative protecting film 14 laid over the chamfered portion of the glass substrate 21 when bent.

The thickness of the insulative protecting film 14 on the side of the plated layer 13 is to be thinner than the thickness of the base polymer film 11, and it is set within a range of 12.5 µm to 50 µm, for example, preferably at 12.5 µm, 25 µm, or 50 µm, and more preferably in a range of 12.5 µm to 25 µm. The insulative protecting film 14 with a thickness below 12.5 µm is difficult to handle and thus difficult to manufacture. Further, a thickness of the insulative protecting film 14 on the side of the plated layer 13 exceeding 50 µm result in poor bendability of the flexible wiring board 10 and is not preferable.

Suitable combinations in thickness of the insulative protecting film 14 on the side of the plated layer 13 and the base polymer film 11 (thickness of insulative protecting film 14 on the side of the plated layer 13/thickness of base polymer film 11) include 12.5 µm/25 µm, 12.5 µm/50 µm, 25 µm/50 µm, 12.5 µm/75 µm, 25 µm/75 µm, 50 µm/75 µm, of which 12.5 µm/25 µm is most preferable.

The thickness of the insulative protecting film 14 on the side of the plated layer 13 is preferably not more than a half the thickness of the base polymer film 11. Thus, for example, when the thickness of the base polymer film 11 is 25 µm, the thickness of the insulative protecting film 14 is preferably set at 12.5 µm. This significantly improves bendability of the flexible wiring board 10.

Namely, bendability can be greatly improved by making the thickness ratio (thickness of insulative protecting film 14 on the side of the plated layer 13/thickness of the base polymer film 11) not more than a half. In particular, the combination of the thickness of the insulative protecting film 14 on the side of the plated layer 13/thickness of base polymer film 11 at 12.5 µm/25 µm (thickness ratio is exactly a half) is desirable in view of bendability, flexibility, and productivity, and is the optimum combination.

The following describes the reasons for this.

Firstly, films such as the base polymer film 11 or insulative protecting film 14 having the industrial standard thickness of 25 µm have additional values that they have better workability than films of other thicknesses and they are easy to obtain. Thus, using the µm film, the combination which satisfies the thickness ratio of ½ is realized preferably by insulative protecting film 14 with a thickness of not more than 12.5 µm, or by base polymer film 11 having the thickness of not less than 50 µm. However, as mentioned above, films thinner than 12.5 µm are difficult to handle (misalignment due to wrinkles is generated and wiring is exposed as a result). On the other hand, films exceeding 50 µm result in poor flexibility. Thus, in view of bendability, flexibility, and productivity, a preferable combination of the base polymer film 11 and the insulative protecting film 14 on the side of the plated layer 13 is the combination of 25 µm and 12.5 µm, or the combination of 50 µm and 25 µm. Further, comparing these two combinations, it was found that the former had more desirable flexibility. Therefore, in the present invention, the optimum combination of the thicknesses of the base polymer film 11 and the insulative protecting film 14 on the side of the plated layer 13 is the combination of 25 µm and 12.5 µm.

The thickness of the insulative protecting film 14 on the far side of the plated layer 13 (upper side in the drawings) may be the same as or thicker than the thickness of the base polymer film 11 because it has less effect on bendability of the flexible wiring board 10; however, as shown in FIG. 2, it is preferably thinner than the thickness of the base polymer film 11. This further improves bendability of the flexible wiring board 10.

The thickness of the insulative protecting film 14 on the far side of the plated layer 13 is set within a range of 12.5 μm to 75 μm, for example, at 12.5 μm, 25 μm, 50 μm, or 75 μm, and when making it thinner than the thickness of the base polymer film 11, within a range of 12.5 μm to 50 μm, for example, at 12.5 μm or 25 μm. The insulative protecting film 14 thinner than 12.5 μm is difficult to handle and thus difficult to manufacture. Further, when the thickness of the insulative protecting film 14 on the far side of the plated layer 13 exceeds 50 μm, bendability of the flexible wiring board 10 suffers and it is not preferable.

Even though the foregoing explanation of the present embodiment was based on the case where the bend angle was 90°, the present invention is also applicable to other bend angles. By the study made by the inventors of the present invention, the effect of preventing wire breakage was also desirable not only at the bend angle of 90° but at 180° as well. Further, the bend angle of 180° allows the bend radius to be smaller than conventionally, making it possible to reduce the picture-frame area of the module (liquid crystal display device).

Second Embodiment

The following will describe a Second Embodiment of the present invention referring to the drawings. Note that, for convenience of explanation, elements having the same functions as those described in the First Embodiment are given the same reference numerals and explanations thereof are omitted here.

Figure 3:
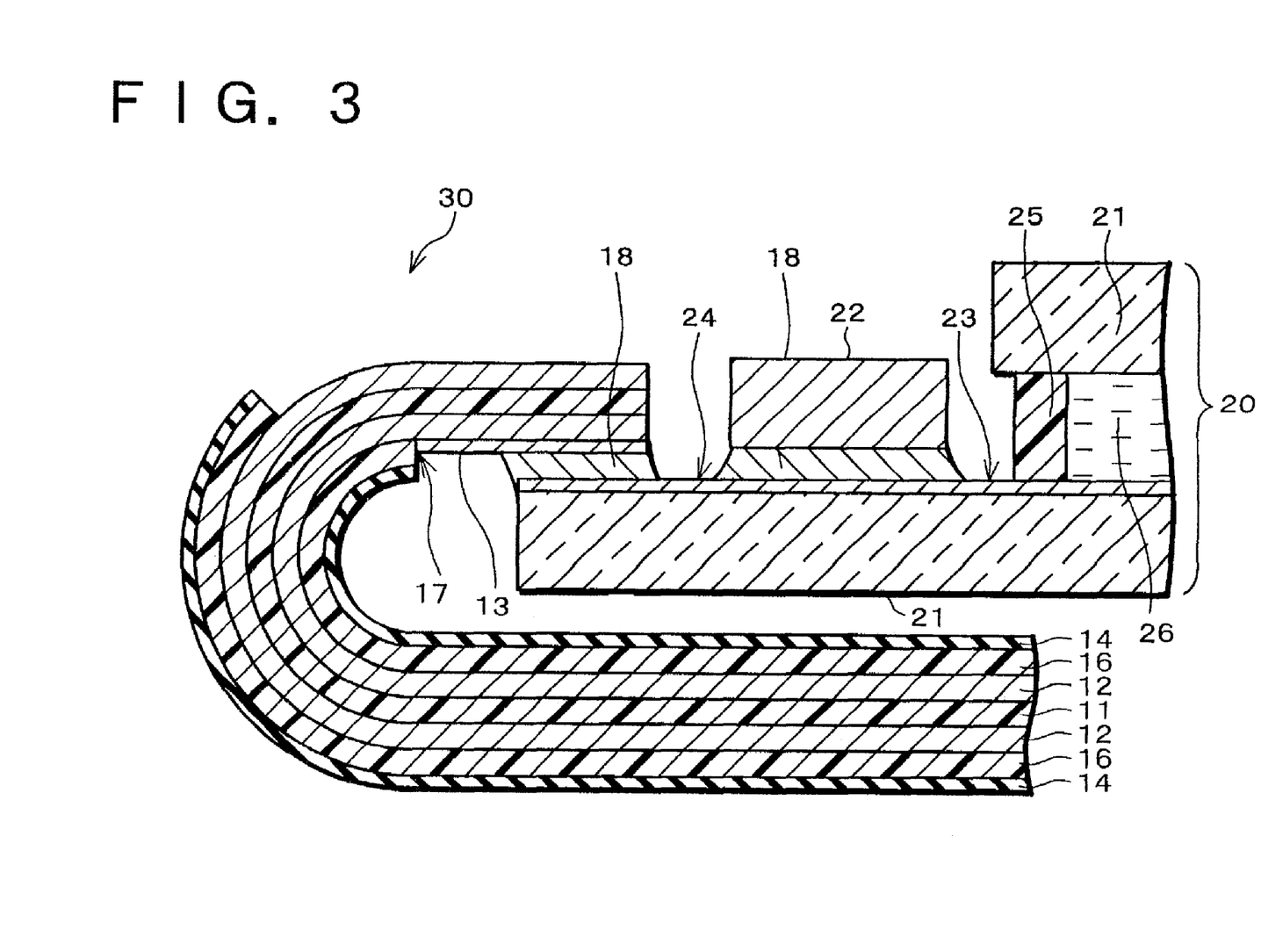
FIG. 3 is a cross sectional view of a flexible wiring board in accordance with yet another embodiment of the present invention when it is connected to a liquid crystal panel and bent 180°.

As shown in FIG. 3, a flexible wiring board 30 of the present embodiment is the same as the flexible wiring board 10 of the First Embodiment except that it is an adhesive-less flexible wiring board where the base polymer film 11 and the copper foil pattern 12 are directly bonded to each other without using the copper foil adhesive layer 15. In this case, the copper foil pattern 12 is formed, for example, by the method in which a copper foil is pressure-welded with the base polymer film and thereafter the copper foil is wet-etched.

As shown in FIG. 3, the flexible wiring board 30 is connected to an end portion on the upper surface of a larger glass substrate 21 (glass substrate 21 on the lower side of FIG. 3) of the liquid crystal panel 20 in which an IC chip 22 is mounted by the COG method, and is bent 180° so that the surface connected to the larger glass substrate faces inward. FIG. 3 shows the case where the thickness of the glass substrate 21 is 0.7 mm.

By thus bending the flexible wiring board 30 180° with the connected surface facing inward, the flexible wiring board 30 is bent, rolling in the end portion of the glass substrate 21. This minimizes the space where the flexible wiring board 30 is disposed. In particular, it is possible to minimize the area of a portion of the larger glass substrate 21 extending beyond the smaller glass substrate 21 (so-called picture-frame area), which is the area where the components to be mounted on the peripheral edge portion of the liquid crystal panel 20 are placed. As a result, it is possible to reduce the size of the liquid crystal display device composed of the liquid crystal panel 20 and the flexible wiring board 30, in particular, the planer dimension (dimension perpendicular to the thickness direction).

In the present embodiment, the thickness of the insulative protecting film 14 is made thinner than that of the base polymer film 11, and preferably to be not more than a half the thickness of the base polymer film 11. Specifically, for example, for the base polymer film 11 having a thickness of 25 μm, the insulative protecting film 14 having a thickness of 12.5 μm is used. This effectively prevents wire breakage of the copper foil pattern 12 at a boundary portion 17 between the insulative protecting film 14 and the plated layer 13 when the flexible wiring board 30 is bent repeatedly 180°.

Further, it is preferable that the boundary portion 17 of the insulative protecting film 14 and the plated layer 13 is distanced by at least 0.2 mm from the edge of the glass substrate 21 connected to the plated layer 13. Thus, it is preferable that the boundary portion 17 between the insulative protecting film 14 which is provided on the side of the plated layer 13 of the base polymer film 11 and the plated layer 13 is distanced by at least 0.2 mm from the edge of the glass substrate 21 connected to the plated layer 13 of the base polymer film 11. With this arrangement, the stress on the connected portion of the flexible wiring board 30 and the glass substrate 21 when bending the flexible wiring board 30 can be relieved to prevent wire breakage, thus improving reliability of the electrical connection at the connected portion. Further, it is possible to prevent bendability (flexibility) from suffering and prevent stress on the connected portion, which may be caused by the insulative protecting film 14 laid over the chamfered portion of the glass substrate 21 when bent.

The following explains results of experiment which was conducted to confirm the effect of the present invention.

Using the flexible wiring board 30 of the present embodiment with the base polymer film 11 having the thickness of 25 μm and the insulative protecting film 14 having the thickness of 12.5 μm, the flexible wiring board 30 was bent 180° for 10 times or more. The result showed that there was no wire breakage of the copper foil pattern 12.

For comparison, using a comparative flexible wiring board having the same arrangement as that of the flexible wiring board 30 except that the thickness of the base polymer film 11 was 12.5 μm and that of the insulative protecting film 14 was 12.5 μm, the flexible wiring board was repeatedly bent 180°. The result showed that there was wire breakage of the copper foil pattern 12 within five times of the bend.

Further, the flexible wiring board 30 of the present embodiment was mounted by bending it 180° with respect to a thin glass substrate 21 having a thickness of 0.7 mm, and a significantly small bend radius of about 0.4 mm was obtained, thus confirming very desirable bendability and flexibility of the flexible wiring board 30 of the present embodiment. Further, by mounting the flexible wiring board 30 of the preset embodiment having the significantly small bend radius on an electrical device such as a liquid crystal panel, it was possible to further reduce the size of the entire device including the electrical device and the flexible wiring board 30.

Even though the present embodiment described the case where the bend angle was 180°, desirable effect of preventing wire breakage was also observed at the bend angle of 90°. Further, the flexible wiring board 30 of the present embodiment and the comparative flexible wiring board were respectively bent 90° and their bend radii were compared. The result showed that the bend radius, which was 0.6 mm or larger in the comparative flexible wiring board (conventional flexible wiring board), was reduced to 0.3 mm in the flexible wiring board 30 of the present embodiment.

Third Embodiment

The foregoing embodiments described the flexible wiring boards having copper foil patterns on the both surfaces; however, a flexible wiring board having the copper foil pattern only on one surface can also be effected.

Figure 4:
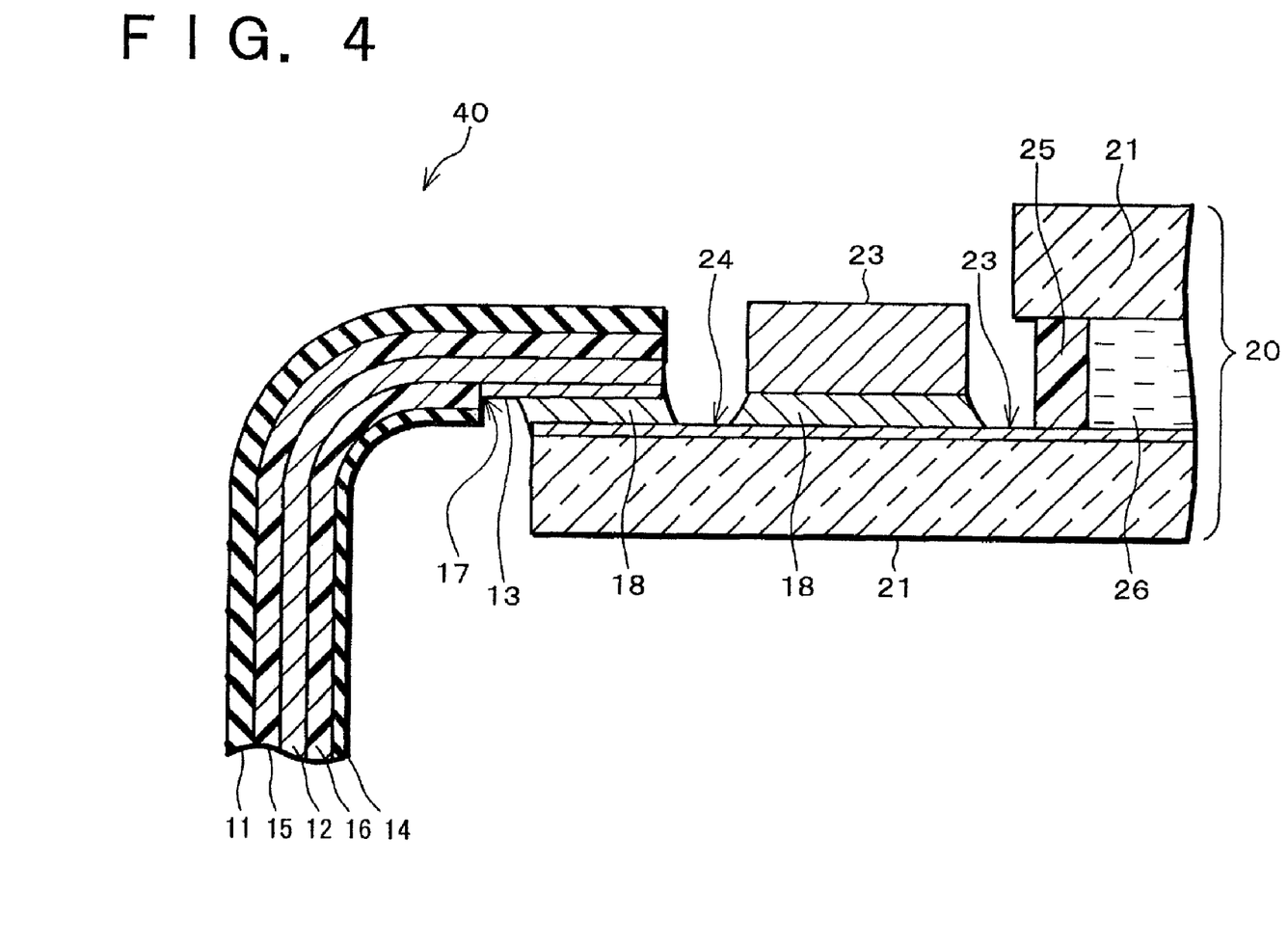
FIG. 4 is a cross sectional view of a flexible wiring board in accordance with still another embodiment of the present invention when it is connected to a liquid crystal panel and bent 90° downward.

Thus, the following will describe another embodiment of the present embodiment referring to FIG. 4 employing a flexible wiring board having the copper foil pattern only on one surface. Note that, for convenience of explanation, elements having the same functions as those described in the First Embodiment will be given the same reference numerals and explanations thereof are omitted here.

As shown in FIG. 4, a flexible wiring board 40 of the present embodiment is the same as the flexible wiring board 10 of the First Embodiment except it does not include the copper foil adhesive layer 15, copper foil pattern 12, insulative protecting film adhesive layer 16, and insulative protecting film 14 on the outer side of the bend (upper side in FIG. 4) of the flexible wiring board 10 of the First Embodiment.

Further, as with the foregoing embodiments, in the present embodiment, the thickness of the insulative protecting film 14 is made thinner than that of the base polymer film 11, and preferably to be not more than a half the base polymer film 11. This makes the difference in rigidity between the portion covered with the insulative protecting film 14 and the portion not covered with the insulative protecting film 14 (portion where plated layer 13 is provided) smaller in the flexible wiring board 40. As a result, the stress on a boundary portion 17 of the insulative protecting film 14 and the plated layer 13 when bending the flexible wiring board 40 can be relieved, thus preventing wire breakage of the copper foil pattern 12.

Further, in the present embodiment, instead of forming the insulative protecting film by curing applied liquid resin with heat, the insulative protecting film is formed by bonding the pre-molded insulative protecting film 14 using an adhesive (insulative protecting film adhesive layer 16), thus making it possible to have a uniform thickness for the insulative protecting film. Therefore, compared with the conventional method of using the ink cover lay, it is ensured that insulation failure is prevented. Further, unlike the case where applied liquid resin is cured by heat, bonding with the adhesive does not require heat to form the insulative protecting film, making it also applicable to copper foil adhesive layer 15 having low heat resistance, thereby widening the applicable field.

The foregoing specifically described the present invention based on the three embodiments. However, the present invention is not just limited to the described embodiments, and is subject to various modifications within the scope of the invention.

For example, in the Third Embodiment, the base polymer film 11 and the copper foil pattern 12 were bonded with each other by the copper foil adhesive layer 15; however, the base polymer film 11 and the copper foil pattern 12 may be directly bonded with each other without using the copper foil adhesive layer 15, as with the Second Embodiment.

Further, the foregoing embodiments described the case where the flexible wiring board was bent so that the surface where the plated layer 13 is provided faces inward. However, the present invention is also applicable to the case where the flexible wiring board is bent so that the surface where the plated layer 13 is provided faces outward.

Further, the foregoing embodiments described the case where the bend angle of the flexible wiring board was set at 90° or 180°, yet the bend angle of the flexible wiring board can be suitably changed. For example, the flexible wiring board of the Third Embodiment may be bent 180° to roll in the end portion of the liquid crystal panel 20, as with the Second Embodiment. This minimizes the space where the flexible wiring board is placed. In particular, it is possible to minimize the area of a portion of the larger glass substrate 21 which extends beyond the smaller glass substrate 21 (so-called picture-frame area), which is the area where the components to be mounted on the peripheral edge portion of the liquid crystal panel 20 are provided. As a result, it is possible to reduce the size of the liquid crystal display device including the liquid crystal panel 20 and the flexible wiring board 40, in particular, the planer dimension (dimension perpendicular to the thickness direction).

Further, the foregoing embodiments described the case where the flexible wiring board in accordance with the present invention was applied to the liquid crystal display element on which the IC chip was mounted by the COG method, yet the flexible wiring board of the present invention is also applicable to the liquid crystal display elements employing other methods. Further, the foregoing embodiments described the case where the flexible wiring board in accordance with the present invention was applied to the liquid crystal display element, yet the flexible wiring board of the present invention is also applicable to other electrical components.

Further, the foregoing embodiments described the case which employed the insulating substrate made of polymer, yet the present invention is also applicable to the case where an insulating substrate made of other insulators is used.

As described, the flexible wiring board of the present invention has an arrangement in which wiring and an insulative protecting film for protecting the wiring are provided only on one surface of the flexible insulating substrate, and a terminal portion to be connected to an external electrical component is provided on the wiring, wherein the insulative protecting film is provided so as to cover the wiring except for at least the terminal portion, and is a polymer film (polymer in the form of a film) which is bonded with the insulating substrate via an adhesive, and is thinner than the insulating substrate.

With this arrangement, by making the thickness of the insulative protecting film thinner than that of the insulating substrate, it is possible to reduce difference in rigidity between a portion of the flexible wiring board covered with the insulative protecting film and a portion not covered with the insulative protecting film. As a result, the stress on the boundary portion between the insulative protecting film and the terminal portion can be relieved, thereby preventing wire breakage of the wiring.

Further, with the foregoing arrangement, since the insulative protecting film is formed by bonding the polymer film with an adhesive, it is possible to obtain a uniform thickness for the insulative protecting film, and compared with the case where the conventional ink cover lay is used, insulation failure can be prevented with certainty. Further, since bonding is made with the use of an adhesive, unlike the conventional ink cover lay, heat is not required to form the insulative protecting film, thus making it applicable to an adhesive having low heat resistance and thereby widening the applicable field.

Further, as described, the flexible wiring board of the present invention has an arrangement in which wiring and an insulative protecting film for protecting the wiring are provided on the both surfaces of the flexible insulating substrate, and a terminal portion to be connected to an external electrical component is provided on the wiring of one surface, wherein the insulative protecting films on the both surfaces are provided so as to cover the wiring on the both surfaces except for at least the terminal portion, and are polymer films which are bonded with the insulating substrate via an adhesive, and at least one of the insulative protecting films which is bonded on the surface provided with the terminal portion is thinner than the insulating substrate.

With this arrangement, by making the thickness of the insulative protecting film which is provided on the surface provided with the terminal portion thinner than that of the insulating substrate, it is possible to reduce a difference in rigidity between a portion of the flexible wiring board covered with the insulative protecting film and a portion not covered with the insulative protecting film. As a result, stress on the boundary portion between the insulative protecting film and the terminal portion can be relieved, thereby preventing wire breakage of the wiring.

Further, with the foregoing arrangement, since the insulative protecting films on the both surfaces are formed by bonding the polymer films with the adhesive, it is possible to obtain a uniform thickness for the insulative protecting films, and compared with the case where the conventional ink cover lay is used, insulation failure can be prevented with certainty. Further, since bonding is made using an adhesive, unlike the conventional ink cover lay, heat is not required to form the insulative protecting films, thus making it applicable to an adhesive having low heat resistance and thereby widening the applicable field.

The thickness of the insulative protecting film covering the wiring of the flexible wiring board on the side where the terminal portion is not provided does not result in strong stress on the boundary portion between the insulative protecting film and the terminal portion, irrespective of whether it is the same as or thicker than the thickness of the insulating substrate. However, in cases where the bend angle is large, for example, the thickness of the insulative protecting film covering the wiring of the flexible wiring board on the side where the terminal portion is not provided becomes a problem. Thus, the thickness of the insulative protecting film covering the wiring of the flexible wiring board on the side where the terminal portion is not provided is more preferably thinner than the thickness of the insulating substrate.

Note that, in each of the foregoing arrangements, the insulative protecting films are thin and may present a slight difficulty in handling, but it is possible to effectively prevent wire breakage of the wiring when bending the flexible wiring board. Thus, by using the flexible wiring boards of the foregoing arrangements in the bent form in manufacture of electrical devices, it is possible to increase the yield of product electrical devices compared with the conventional flexible wiring board used in the bent form in manufacture of electrical devices.

In the flexible wiring boards of the foregoing arrangements, the thickness of the insulative protecting film which is thinner than the insulating substrate is preferably a half or less than the thickness of the insulating substrate. This significantly improves bendability of the flexible wiring board. That is, it is possible to further relieve stress on the boundary portion between the insulative protecting film and the terminal portion when bending the flexible wiring board, thereby preventing wire breakage of the wiring with certainty.

Further, in the flexible wiring boards of the foregoing arrangements, it is preferable that the terminal portion is provided only on one of the wiring, and one of the insulative protecting films which is provided on one side of the insulating substrate opposite the terminal portion is disposed such that one end (side) of the insulative protecting film closer to the terminal portion is farther away from one end (side) of the insulating substrate where the terminal portion is provided than one end (side) of the other insulative protecting film which is provided on the side of the terminal portion of the insulating substrate closer to the terminal portion. Alternatively, in the flexible wiring boards of the foregoing arrangements, it is preferable that the insulating substrate has blank areas on the both surfaces thereof where the insulative protecting films are not provided, and the terminal portion is formed on one of the blank areas where the insulative protecting film is not provided, and the area of the blank area on the other side of the insulating substrate opposite the terminal portion is wider than the area of the blank area of the side the terminal portion is provided. With this arrangement, it is possible to relieve stress on the terminal portion when bending the flexible wiring board of the foregoing arrangement with the terminal portion facing inward, thereby preventing wire breakage of the wiring further effectively. This is possible because the flexible wiring board can be bent much more easily by reducing the total thickness at the bent portion by making the area where the outer insulative protecting film is provided smaller than the area where the inner insulative protecting film is provided.

Further, it is preferable that the boundary portion between the insulative protecting film and the terminal portion is distanced by at least 0.2 mm from the end of the substrate of the external electrical device which is connected to the terminal portion of the insulating substrate. Thus, it is preferable to provide a distance of at least 0.2 mm between (a) the boundary portion of the insulative protecting film which is provided on the side of the insulating substrate where the terminal portion is provided and the terminal portion and (b) the end of the substrate of the external electrical device which is connected to the terminal portion of the insulating substrate. With this arrangement, it is possible to prevent wire breakage by relieving stress on the connected portion between the flexible wiring board and the substrate when the flexible wiring board of the foregoing arrangement is connected to the substrate of the external electrical device and bent in the vicinity of the substrate with the terminal portion facing inward, thereby improving reliability of the electrical connection at the connected portion. Further, it is possible to prevent bendability (flexibility) from suffering and prevent stress on the connected portion, which may be caused by the interference between the insulative protecting film and the end of the substrate.

Note that, it is preferable that the insulative protecting film or the insulating substrate has the thickness of about 25 µm. At present, films such as the insulative protecting film or insulating substrate having the industrial standard thickness of 25 µm have additional values that they have better workability than films of other thicknesses and they are easy to obtain. Thus, the flexible wiring board having the insulative wiring board or insulating substrate with the thickness of about 25 µm has the advantage that it can be manufactured easily.

As described, the electrical device of the present invention has the arrangement including the flexible wiring board and the electrical component, wherein one end of the flexible wiring board is connected to the electrical component while being laid on the electrical component, and the flexible wiring board is bent at a position other than the terminal portion.

With this arrangement, as described, in addition to providing an electrical device which can prevent insulation failure of the insulative protecting film of the flexible wiring board with certainty as well as wire breakage of the wiring when bent, the flexible wiring board can be stored in the electrical device by being bent with a smaller bend radius than with the conventional flexible wiring board, thus reducing the size of the electrical device. Further, with the foregoing arrangement, it is possible to increase the yield in manufacture compared with the electrical device using the conventional flexible wiring board.

In the foregoing arrangement, it is preferable that the terminal portion is connected to the end of the external electrical component, and the flexible wiring board is bent so that the surface provided with the terminal portion faces inward. This allows the flexible wiring board to be bent, rolling in the end of the external electrical component, thereby minimizing the space where the flexible wiring board is provided. Further, in the flexible wiring board having the wiring and the insulative protecting film on the both sides, by making the thickness of the insulative protecting film covering the wiring on the side of the terminal portion thinner than the thickness of the insulating substrate, it is possible to further increase flexibility of the flexible wiring board to improve bendability, and to further relieve stress on the boundary portion between the insulative protecting film and the terminal portion to prevent wire breakage of the wiring with more certainty.

The present invention exhibits distinguishing effect when applied to an electrical device in which the flexible wiring board supplies signals to a liquid crystal display element via wiring, i.e., a liquid crystal display device. Namely, it is possible to minimize a cross sectional area (so-called picture-frame area), taken along the plane of the liquid crystal display element, of a space where components to be mounted on the peripheral portion of the liquid crystal display element such as the liquid crystal panel are provided, thus reducing the external size of the liquid crystal display device, in particular, the planer dimension (dimension perpendicular to the thickness direction).

Note that, in the present invention, "bending" not only refers to bending which would make a bend line but also curving which would form an arch about an axis of a given line.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A bent flexible wiring board comprising:
   a bent flexible insulating substrate;
   first bent wiring provided on one surface of the insulating substrate;
   first bent insulative protecting film, provided on one surface of the insulating substrate, for protecting the first wiring;
   second bent wiring provided on the other surface of the insulating substrate;
   second bent insulative protecting film, provided on the other surface of the insulating substrate, for protecting the second wiring; and
   a terminal portion, provided on at least one of the first wiring and the second wiring at an end thereof, to be connected to an external electrical component,
   wherein:
   said first insulative protecting film and said second insulative protecting film are both polymer film, and are placed to cover the first wiring and the second wiring except for at least the terminal portion, and are bonded with the insulating substrate via an adhesive,
   at least one of said first insulative protecting film and said second insulative protecting film, which is connected to the surface on which the terminal portion is provided is thinner than the insulating substrate,
   said terminal portion is provided only on the first wiring, and
   an end of the second insulative protecting film closer to the terminal portion, the second insulative protecting film being on a side of the substrate opposite the terminal portion, is farther away from an end of the insulating substrate where the terminal portion is provided than an end of the first insulative protecting film closer to the terminal portion.

2. The flexible wiring board of claim 1, wherein said first and second wirings, which are on opposite sides of said flexible insulating substrate, are in electrical communication with each other via a through hole.

3. The board of claim 1, wherein a thickness of the other insulative protecting film, which is furthest from the terminal portion, is the same as or thicker than a thickness of the substrate.

4. The board of claim 1, wherein a thickness of the other insulative protecting film, which is furthest from the terminal portion, is greater than the thickness of the insulating protecting film closest to the terminal portion.

5. The board of claim 1, wherein a thickness of the insulative protecting film closest to the terminal portion is not more than half as thick as the substrate.

6. A flexible wiring board comprising:
   a flexible insulating substrate that is bent;
   a first bent wiring provided on one surface of the insulating substrate;
   a first bent insulative protecting film, provided on one surface of the insulating substrate, for protecting the first wiring;
   a second bent wiring provided on the other surface of the insulating substrate;
   a second bent insulative protecting film, provided on the other surface of the insulating substrate, for protecting the second wiring;
   wherein a part of an end portion of at least one of the first wiring and the second wiring represents a terminal portion, said part representing the terminal portion being exposed and to be connected to an external electrical component,
   wherein said first insulative protecting film and said second insulative protecting film are both polymer-based, and are placed to cover the first wiring and the second wiring except for at least the terminal portion, and are bonded with the insulating substrate via an adhesive,
   at least one of said first insulative protecting film and said second insulative protecting film, which is connected to the surface on which the terminal portion is provided, is thinner than the insulating substrate,
   wherein only the first wiring has said terminal portion, and
   wherein an end of the second insulative protecting film closer to the terminal portion, the second insulative protecting film being on a side of the substrate opposite the terminal portion, is farther away from an end of the insulating substrate where the terminal portion is provided than an end of the first insulative protecting film closer to the terminal portion.

7. The flexible wiring board of claim 6, wherein said first and second wirings, which are on opposite sides of said flexible insulating substrate, are in electrical communication with each other via a through hole.

8. The board of claim 6, wherein a thickness of the other insulative protecting film, which is furthest from the terminal portion, is the same as or thicker than a thickness of the substrate.

9. The board of claim 6, wherein a thickness of the other insulative protecting film, which is furthest from the terminal portion, is greater than the thickness of the insulating protecting film closest to the terminal portion.

10. The board of claim 6, wherein a thickness of the insulative protecting film closest to the terminal portion is not more than half as thick as the substrate.

* * * * *